United States Patent
Banks et al.

(10) Patent No.: US 7,278,086 B2
(45) Date of Patent: Oct. 2, 2007

(54) IDENTIFYING UNCORRECTABLE CODEWORDS IN A REED-SOLOMON DECODER FOR ERRORS AND ERASURES

(75) Inventors: David Murray Banks, Bristol (GB); Jonathan Jedwab, Vancouver (CA); James A Davis, Richmond, VA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 839 days.

(21) Appl. No.: 10/632,123

(22) Filed: Jul. 30, 2003

(65) Prior Publication Data
US 2006/0174181 A1    Aug. 3, 2006

(30) Foreign Application Priority Data
Jul. 31, 2002    (GB)    ................. 0217791.3

(51) Int. Cl.
*H03M 13/00* (2006.01)
(52) U.S. Cl. .................................... 714/784
(58) Field of Classification Search ................. 714/784
See application file for complete search history.

(56) References Cited

U.S. PATENT DOCUMENTS

| | | | | |
|---|---|---|---|---|
| 4,868,828 A | 9/1989 | Shao et al. | ................. | 714/704 |
| 5,099,482 A | 3/1992 | Cameron | ................. | 714/784 |
| 5,130,990 A | 7/1992 | Hsu et al. | ................. | 714/784 |
| 5,170,399 A | 12/1992 | Cameron et al. | ................. | 714/784 |
| 5,323,402 A | 6/1994 | Vaccaro et al. | ................. | 714/182 |
| 5,373,511 A | 12/1994 | Veksler | ................. | 714/755 |
| 5,377,207 A | 12/1994 | Perlman | ................. | 714/784 |
| 5,414,719 A * | 5/1995 | Iwaki et al. | ................. | 714/785 |
| 5,642,367 A | 6/1997 | Kao | ................. | 714/784 |
| 5,715,262 A | 2/1998 | Gupta | ................. | 714/784 |
| 5,771,244 A | 6/1998 | Reed et al. | ................. | 714/752 |
| 5,996,103 A | 11/1999 | Jahanghir | ................. | 714/755 |
| 6,131,178 A | 10/2000 | Fujita et al. | ................. | 714/784 |
| 6,347,389 B1 | 2/2002 | Boyer | ................. | 714/784 |
| 7,096,409 B2 | 8/2006 | Banks | ................. | 714/784 |

FOREIGN PATENT DOCUMENTS

| | | |
|---|---|---|
| EP | 0 133 137 A1 | 8/1985 |
| EP | 0 620 654 A2 | 10/1994 |
| EP | 0 296 828 A2 | 12/1998 |
| EP | 0 918 334 A2 | 5/1999 |
| WO | 97/00559 | 1/1997 |

OTHER PUBLICATIONS

U.S. Appl. No. 10/632,130, filed Jul. 30, 2003, Banks et al.
Berlekamp, E., et al., "A Hypersystolic Reed-Solomon Decoder," *Reed-Solomon Codes and Their Applications*, IEEE Press, New York, pp. 205-241 (1994).
Berlekamp, E., "Bit-Serial Reed-Solomon Encoders," *IEEE Transactions on Information Theory*, vol. IT-28, No. 6, pp. 869-874 (Nov. 1982).
Berlekamp, E., "Bounded Distance + 1 Soft-Decision Reed-Solomon Decoding," *IEEE Transactions on Information Theory*, vol. 42, No. 3, pp. 704-720 (May 1996).

* cited by examiner

*Primary Examiner*—Shelly A Chase

(57) ABSTRACT

A method and apparatus for identifying uncorrectable Reed-Solomon codewords in the presence of Reed-Solomon codewords which may have errors and erasures and otherwise be correctable.

9 Claims, 2 Drawing Sheets

IDENTIFYING UNCORRECTABLE CODEWORDS IN A REED-SOLOMON DECODER FOR ERRORS AND ERASURES

TECHNICAL FIELD

The present invention relates in general to a Reed-Solomon decoder. More particularly, the invention relates to a method and apparatus for identifying uncorrectable codewords in the presence of errors and erasures.

BACKGROUND OF THE INVENTION

Reed-Solomon RS error correcting codes are applicable to a wide variety of environments. The most noteable examples are data storage, such as on optical disc media or solid state media, and long-distance data transmissions, such as from deep space to earth.

RS encoded data comprises codewords each having a predetermined number of symbols. When RS encoded data is stored or transmitted, the value of one or more symbols in a codeword may become corrupt, i.e. become changed to an incorrect value or become unknown. This is termed a symbol error. In some environments, the location of a corrupt symbol can be predicted and declared in advance of decoding (e.g. because data could not be read from a storage media, or part of a data transmission was not received). This is termed a symbol erasure. The term errata refers generally to either errors or erasures.

Most RS decoders handle only errors. However, some known RS decoders are able to perform decoding handling both errors and erasures. Here, the decoder receives erasure information, which indicates the location of zero or more suspected corrupt symbols within a codeword. Conveniently, a one bit erasure indicator is applied to each symbol, to indicate whether that symbol has been declared as an erasure. An RS (B,B-2T) code forms codewords of length B and is mathematically guaranteed to correct up to T symbol errors, and up to 2T symbols erasures, or any pattern of E symbol errors and J symbol erasures, provided that $2E+J \leq 2T$. To correct an error, the decoder must find both its location and its magnitude, whereas to correct an erasure, only the magnitude of the correction must be found. Hence, erasure information allows more corrupt symbols to be corrected, compared with the situation where the erasure information is not available.

When a received codeword is passed to the decoder for decoding, the number of declared erasures is known. However, the number of errors is not known and must be determined by the decoder. On occasion, a codeword is encountered which is so severely corrupted that the decoder is unable to provide a reliable, mathematically accurate, correction, i.e. the received codeword is uncorrectable. It is important in many practical environments to determine that an uncorrectable codeword has been received.

An example prior art apparatus for detecting uncorrectable error patterns is disclosed in U.S. Pat. No. 5,099,482 (Idaho Research Foundation). However, this prior art apparatus is not applicable to a Reed-Solomon decoder that is able to handle both errors and erasures.

An aim of the present invention is to provide a method and apparatus for identifying uncorrectable Reed-Solomon codewords in the presence of errors and erasures. A preferred aim is to distinguish between correctable and uncorrectable codewords accurately and cost-efficiently.

BRIEF SUMMARY OF THE INVENTION

According to a first aspect of the present invention there is provided a method of identifying uncorrectable codewords in a Reed-Solomon decoder handling errors and erasures, comprising the steps of: indicating an uncorrectable codeword when any one or more of the following conditions (a) to (f) is satisfied:
  (a) no solution to key equation $\sigma(x)T(x) \equiv \omega(x) \bmod x^{2T}$;
  (b) $\deg\sigma(x) \neq$ nerrors;
  (c) error and erasure locations coincide;
  (d) $\deg\omega(x) \geq$ nerrors+nerasures;
  (e) nerasures+2*nerrors>2T; and
  (f) an error location has a zero correction magnitude;

where nerrors and nerasures represent, respectively, a number of errors with reference to an error locator polynomial $\sigma(x)$ and a number of erasures with reference to an erasure locator polynomial $\Lambda(x)$, 2T is the strength of a Reed-Solomon code, $\omega(x)$ is an errata evaluator polynomial, and T(x) is a modified syndrome polynomial.

Preferably the method comprises evaluating the condition (a) as a preliminary step, and then evaluating the conditions (b) to (f).

Preferably, the method comprises identifying a codeword as correctable if none of at least the conditions (a) to (f) are satisfied.

Optionally, the method comprises indicating an uncorrectable codeword in response to condition (g) $\deg\Lambda(x) \neq$ nerasures.

Preferably, the method comprises receiving the error locator polynomial $\sigma(x)$, the erasure locator polynomial $\Lambda(x)$ and the errata evaluator polynomial $\omega(x)$; forming a set of error locations, and a set of erasure locations, and forming variables nerrors and nerasures representing the size of each set, respectively; and finding $\deg\sigma(x)$, $\deg\Lambda(x)$, and $\deg\omega(x)$, as a degree of the error locator polynomial $\sigma(x)$, the erasure locator polynomial $\Lambda(x)$ and the errata evaluator polynomial $\omega(x)$, respectively.

According to a second aspect of the present invention there is provided a detector circuit arranged to identify an uncorrectable codeword, for use in Reed-Solomon decoder handling errors and erasures, the circuit comprising: a logic unit arranged to identify each condition:
  (a) no solution to key equation $\sigma(x)T(x) \equiv \omega(x) \bmod x^{2T}$;
  (b) $\deg\sigma(x) \neq$ nerrors;
  (c) error and erasure locations coincide;
  (d) $\deg\omega(x) \geq$ nerrors+nerasures;
  (e) nerasures+2*nerrors>2T; and
  (f) an error location has a zero correction magnitude;

where nerrors and nerasures represents, respectively, a number of errors and erasures with reference to an error locator polynomial $\sigma(x)$ and an erasure locator polynomial $\Lambda(x)$, 2T is the strength of a Reed-Solomon code, $\omega(x)$ is an errata evaluator polynomial, and T(x) is a modified syndrome polynomial; and an indicator unit arranged to indicate an uncorrectable codeword, responsive to the logic unit.

Preferably, the circuit comprises a counter arranged to count nerrors and nerasures as the size of a set of error locations derived from the error locator polynomial $\sigma(x)$, and a set of erasure locations derived from the erasure locator polynomial $\Lambda(x)$, respectively.

Optionally, the logic unit is arranged to identify an uncorrectable codeword in response to condition (g) $\deg\Lambda(x) \neq$ nerasures.

For a better understanding of the invention, and to show how embodiments of the same may be carried into effect, reference will now be made, by way of example, to the accompanying diagrammatic drawings in which:

DETAILED DESCRIPTION

Reed-Solomon (RS) codes are a special subclass of generalised BCH codes. A Reed-Solomon code of the form RS (B,B-2T,T) defined in a Galois field GF($2^w$) forms codewords of length B≦$2^w$−1, where w is a positive integer. In each codeword of length B symbols, B-2T of these symbols are information symbols, and the remaining 2T symbols are check symbols.

The generator polynomial g(x) of an RS code can be expressed in the form:

$$g(x) = (x + \alpha^L)(x + \alpha^{L+1})(x + \alpha^{L+2})\ldots(x + \alpha^{L+2T-1})$$
$$= g_0 + g_1 x + g_2 x^2 + \ldots + g_{2T-1} x^{2T-1} + x^{2T}$$

where α is a primitive element in GF ($2^w$) and L is an integer constant. Different generating polynomials are formed with different values for L. By carefully choosing the constant L, the circuit complexity of the encoder and decoder can be reduced. In most practical cases it is convenient to let L=1.

When original data is encoded using an RS encoder employing the generator polynomial g(x), an original codeword c(x) is produced which can be represented by the polynomial:

$$c(x) = c_{B-1} x^{B-1} + c_{B-2} x^{B-2} + \ldots + c_2 x^2 + c_1 x + c_0$$

Let an error pattern e(x), caused for example during data storage or data transmission, be represented by the polynomial:

$$e(x) = e_{B-1} x^{B-1} + e_{B-2} x^{B-2} + \ldots + e_2 x^2 + e_1 x + e_0$$

Let a received codeword d(x) be represented by the polynomial:

$$d(x) = d_{B-1} x^{B-1} + d_{B-2} x^{B-2} + \cdots + d_2 x^2 + d_1 x + d_0$$
$$= c(x) + e(x)$$

The received codeword d(x) may be perfect, or may be corrupted. Hence, it is desired to check and, if necessary, correct the received codeword, using an RS decoder.

A Reed-Solomon decoder can be implemented in software, or in hardware, or as a combination of software and hardware. The RS decoder described herein is particularly suitable for implementation in hardware using VLSI techniques to form an ASIC (Application Specific Integrated Circuit).

A preferred Reed-Solomon decoder will first be described, with reference to FIG. 1. Then, a preferred circuit for detecting uncorrectable codewords will be described, with reference to FIG. 2.

Figure 1:
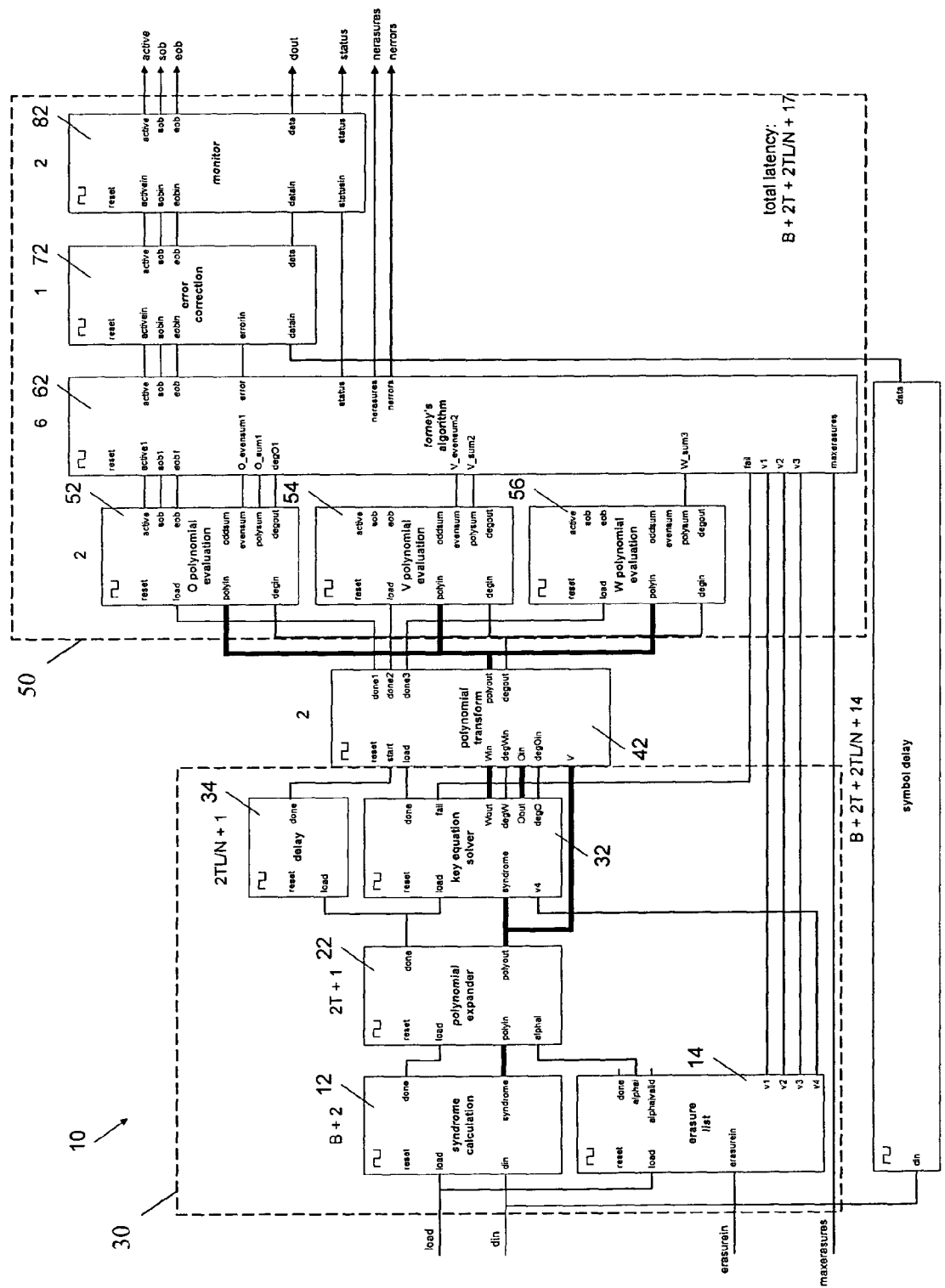
FIG. 1 is a schematic block diagram of a preferred Reed-Solomon decoder.

The preferred decoder of FIG. 1 comprises a polynomial generation unit 30, a polynomial evaluation unit 50, and a transform unit 42.

A codeword received by the decoder 10 is passed to the polynomial generation unit 30, which generates polynomials representing locations and magnitudes of errors and erasures. In this embodiment the polynomial generation unit 30 generates an error locator polynomial σ(x), an erasure locator polynomial Λ(x) and an errata evaluator polynomial ω(x). These three polynomials are passed to the polynomial evaluation unit 50, which performs a Chien search and solves Forney's equations to determine correction locations and correction magnitudes to be applied to the received codeword.

Referring to FIG. 1, the preferred polynomial generation unit 30 and polynomial evaluation unit 50 will now be described in more detail.

The polynomial generation unit 30 comprises a syndrome calculation block 12, an erasurelist block 14, a polynomial expander 22, a key equation solving unit 32, and a delay 34.

The syndrome calculation block 12 is arranged to receive a codeword containing B symbols. The symbols of the codeword form the coefficients of a polynomial, where the first symbol received is $d_{B-1}$ and the last symbol received is $d_0$. The received codeword can be represented as:

$$d(x) = d_0 + d_1 x + d_2 x^2 + d_3 x^3 + \ldots + d_{B-1} x^{B-1}$$

The syndromes are obtained by evaluating this polynomial at the roots of the generator polynomial. The generator polynomial has 2T distinct roots ($\alpha, \alpha^2, \alpha^3, \ldots, \alpha^{2T}$), and therefore there are 2T syndromes to be calculated. This assumes that L, where $\alpha^L$ is the starting root of the generator polynomial g(x), is given by L=1, but other values of L are also applicable. Suitably, the calculation of each syndrome is performed recursively, using Horner's rule.

The erasurelist block 14 receives erasure information identifying zero or more symbols in the codeword which have been declared as erasures. Any suitable mechanism can be used to declare erasures, according to the environment in which the RS decoder 10 is employed.

The erasurelist block 14 is formed as a FIFO structure to maintain a list of up to 2T erasure locations. If the first symbol of the codeword is an erasure, then a value of $\alpha^{-(B-1)}$ is queued in the FIFO. If the next symbol is an erasure, then $\alpha^{-(B-2)}$ queued in the FIFO, and so on.

In the architecture of the preferred RS decoder, only a single polynomial expander 22 is provided which calculates both (a) the erasure locator polynomial Λ(x), and (b) the modified syndrome polynomial T(x). In both cases, the same basic operation is used:

$$\text{polyout}(x) = \text{polyin}(x) \cdot (x + \alpha^{-v0})(x + \alpha^{-v1})(x + \alpha^{-v2}) \ldots (x + \alpha^{-vJ-1})$$

To calculate T(x), the initial value loaded into polyin(x) is S(x). To calculate Λ(x), the initial value loaded into polyin (x) is 1.

Conveniently, the same hardware is used to generate both T(x) and Λ(x), by time multiplexing these two functions of the polynomial expander 22. That is, in a first mode the polynomial expander 22 generates T(x) and passes the result to the key equation block 32. Then, in a second mode, the polynomial expander 22 generates Λ(x).

The key equation block 32 receives the modified syndrome polynomial T(X) from the polynomial expander 22, and from T(x) calculates values of the error locator polynomial σ(x) and the errata evaluator polynomial ω(x) that solve the key equation:

$$\sigma(x) \cdot T(x) \equiv \omega(x) \bmod x^{2T}$$

The key equation block 32 preferably applies Euclid's algorithm to solve the key equation. In alternate embodiments of the invention, the key equation block 32 is replaced by a functional equivalent. For example, alternate approaches to solving the key equation and finding σ(x) and ω(x) include Berlekamp, Berlekamp-Massey, and continued fractions.

A detailed discussion as background to the preferred implementation of Euclid's algorithm is provided in the paper "A Hypersystolic Reed-Solomon Decoder" by E. Berlekamp, G. Seroussi and P. Tong published at pages 205-241 of "Reed-Solomon Codes and their Applications", Edited by S. B. Wicker and V. K. Bhargava, IEEE Press, New York, 1994, ISBN 0-7803-1025-X.

The latency through the key equation block varies depending on the number of erasures J. The delay block 34 is provided to ensure that the decoder as a whole has constant latency. The delay block 34 indicates that a valid output of the key equation block 32 is available a constant number of cycles after the Euclidean computation starts, rather than on its completion.

The polynomial evaluation unit 50 comprises first, second and third polynomial evaluators, 52, 54 and 56, a Forney block 62, a correction block 72, and a monitor block 82.

Three polynomial evaluators 52, 54, and 56 are provided to evaluate σ(x), Λ(x) and ω(x), respectively. The first polynomial evaluator 52 is used to determine the roots of the error locator polynomial σ(x), which indicate the locations of symbol errors. An exhaustive search is used to determine these roots, suitably a Chien search or equivalent. Similarly, the second polynomial evaluator 54 performs an equivalent function for the erasure locator polynomial Λ(x). The third polynomial evaluator 56 evaluates the errata evaluator polynomial ω(x).

Optionally, the transform block 42 is provided to implement a polynomial transformation which allows a Chien search to be performed immediately, and avoids a delay corresponding to "empty" information symbols in a shortened codeword of length $B<2^w-1$. Here, the $i^{th}$ coefficient of an input polynomial is transformed by a factor of $\alpha^{(2^w-B)i}$. There are three polynomials that require this transformation, namely the error locator polynomial σ(x) and the errata evaluator polynomial ω(x) from the key equation block 32, and the erasure locator polynomial Λ(x) from the polynomial expander block 22. Once a control signal "start" is asserted, these polynomials are processed over successive clock cycles. Three "done" signals indicate to subsequent blocks when each transformed polynomial (and its true degree) is available.

The Forney block 62 is implemented as a pipelined datapath, driven by the three polynomial evaluation blocks 52, 54, 56 for σ(x), Λ(x) and ω(x). There is one cycle skew between each of these blocks, due to the transform block 42, and thus the results feed into the datapath at different stages.

As described previously, a Chien search (or equivalent) is performed by the polynomial evaluators 52, 54, 56 evaluating σ(x), ω(x) and Λ(x) for $x \in \{\alpha^{-(B-1)} \ldots \alpha^{-(0)}\}$. From these values, Forney equations are used in the Forney block 62 to calculate the error magnitudes.

In the preferred embodiment, the Forney equations are applied in the form that if σ(x)=0 for some $x=\alpha^{-i}$ then an error has occurred in symbol i, and the error magnitude is given by:

$$E_i = \frac{\omega(x)}{\sigma'(x) \cdot \Lambda(x)} \text{ for } x = \alpha^{-i};$$

and if Λ(x)=0 for some $x=\alpha^{-i}$ then an erasure has occurred in symbol i, and the erasure magnitude is given by:

$$J_i = \frac{\omega(x)}{\sigma(x) \cdot \Lambda'(x)} \text{ for } x = \alpha^{-i}$$

The symbol delay block 16 introduces a delay to the symbol data of the received codeword, to compensate for the delay through the other blocks in the decoder.

The error correction block 72 performs errata correction by XORing the delayed symbol data of the received codeword with the correction output of the Forney block 62.

The monitor block 82 is optionally provided as a final pipeline stage within the decoder. As an additional check, the decoder re-calculates the syndromes over each sequence of symbols output by the decoder, in the monitor block 82. This allows mistakes in the decoder to be identified, and confirms that uncorrectable codewords are correctly identified.

Figure 2:
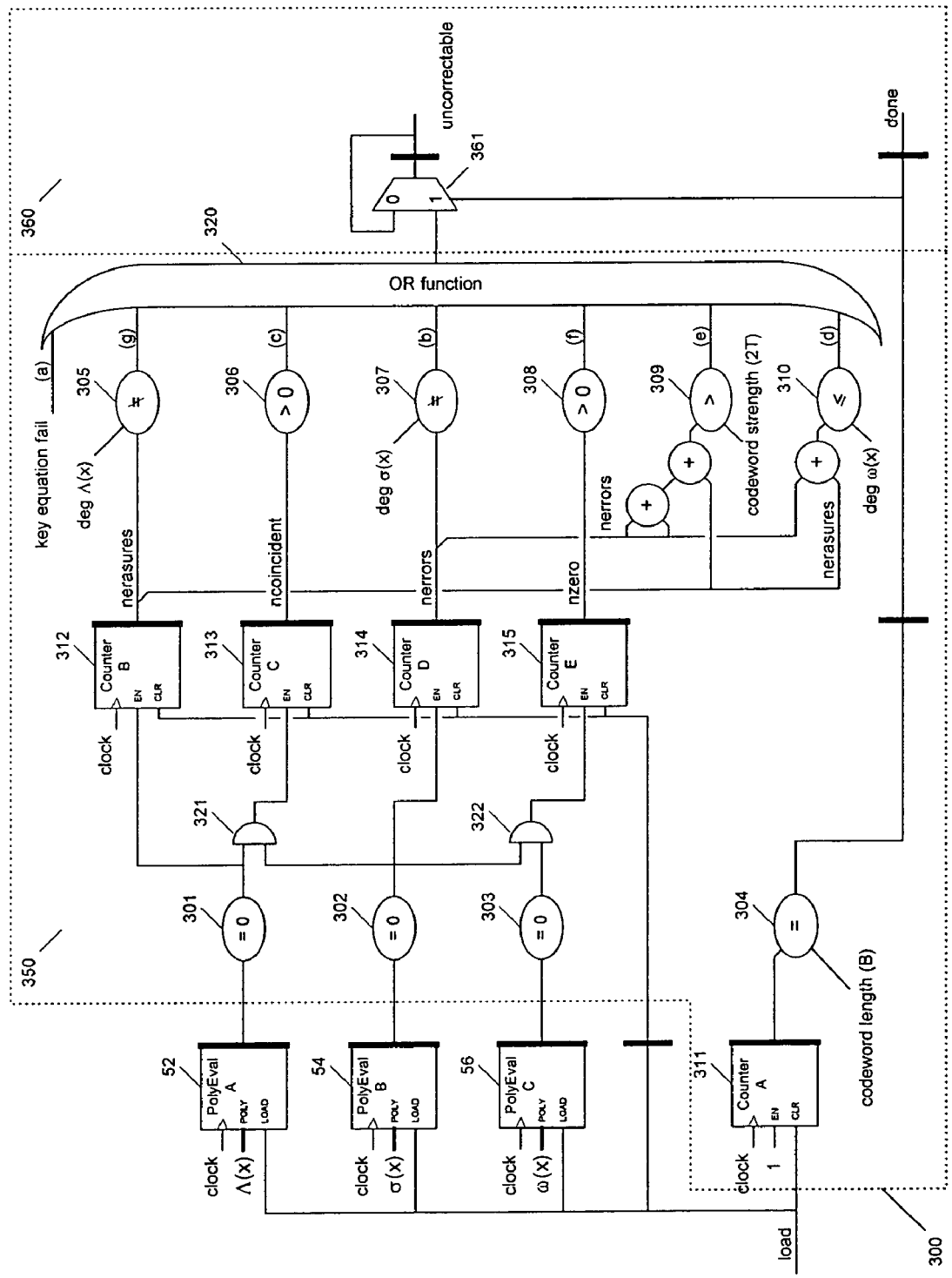
FIG. 2 is a schematic circuit diagram of a circuit for identifying uncorrectable codewords.

FIG. 2 shows an example circuit arranged to detect uncorrectable codewords. The circuit 300 is suitably implemented as part of the Forney block 62.

The detector circuit 300 comprises a logic unit 350 that performs first through seventh logic functions (a) to (g), as will be described below, and an indicator unit 360 that provides an output identifying uncorrectable codewords.

In one embodiment, the logic unit 350 comprises first through tenth comparators 301-310, first through fifth counters 311-315, and an OR block 320. The indicator unit 360 comprises an output latch 361. However, it will be appreciated that the circuit of FIG. 2 is merely one example and a number of alternative implementations will perform equivalent logic functions.

The detector circuit 300 identifies a codeword as uncorrectable if any one or more of the following conditions (a) to (f) are met. Condition (g) is preferred, but optional. Conversely, a codeword is deemed to be correctable if none of the conditions (a) to (f) are met, or optionally none of (a) to (g).

Condition (a): No Solution to Key Equation

In a first logic function it is determined whether a solution could be fould to the key equation $\sigma(x)T(x) \equiv \omega(x) \bmod x^{2T}$. If not, then a received codeword is identified as being uncorrectable.

In the preferred RS decoder of FIG. 1, the key equation unit 32 indicates a fail when a solution to the key equation $\sigma(x)T(x) \equiv \omega(x) \bmod x^{2T}$ could not be found. Conveniently, in the case of key equation unit 32 based on Euclid's algorithm as described above, this failure condition is indicated by Euclid's algorithm terminating in the middle of a division step. Suitably, the circuit 300 receives a "fail" signal from the key equation block 32, as a first logic function input (a) to the OR block 320.

This first logic function is suitably performed as a preliminary step. Only if condition (a) is passed does the circuit need to evaluate the other conditions (b) to (g).

Conditions (b) to (g):

Suitably, a set of error locations and a set of erasure locations are formed. These two sets then allow conditions (b) to (g) to be evaluated quickly and conveniently. If available from elsewhere in the decoder, these sets may simply be passed to the detector circuit 300.

The set of error locations $\{\alpha^{-i}, \ldots\}$ is formed from the error locator polynomial $\sigma(x)$, by adding $\alpha^{-i}$ to the set for each symbol i in a codeword of length B symbols where the error locator polynomial $\sigma(\alpha^{-i})=0$ for $0 \leq i < B$. A variable nerrors is defined to be the size of this set, to represent the number of errors. The set of error locations is suitably formed by a Chien search, or equivalent. In the preferred decoder of FIG. 1, the Chien search is performed by the polynomial evaluator 54. The detector circuit 300 of FIG. 2 counts the variable nerrors, using a null detecting comparator 302 and a counter 314.

The set of erasure locations $\{\alpha^{-i}, \ldots\}$ may be formed directly or indirectly. When formed directly, the set is obtained by recalling a set of declared erasure locations, i.e. which were input to the decoder with a received codeword. However, in the example of FIG. 2, the set is calculated indirectly from the erasure locator polynomial $\Lambda(x)$, by adding $\alpha^{-i}$ to the set for each symbol i in a codeword of length B symbols where the erasure locator polynomial $\Lambda(\alpha^{-i})=0$ for $0 \leq i < B$. A variable nerasures is defined as the size of the set of erasure locations. In FIG. 2, an output of the polynomial evaluator 52 is fed to a null detecting comparator 301, from which a counter 312 counts nerasures.

Further, the degree (i.e. power of the highest power term) of each of the error locator polynomial $\sigma(x)$, the erasure locator polynomial $\Lambda(x)$ and the errata evaluator polynomial $\omega(x)$ is made available to the detector circuit, such as from the polynomial evaluators 52, 54 and 56, or the Forney block 62.

Condition (b): $\deg\sigma(x) \neq$ nerrors

In this second logic function, the variable nerrors is compared with the degree of $\sigma(x)$, using the seventh comparator 307, which forms a second input (b) to the OR gate 320. If the compared values are not equal, then an uncorrectable codeword is declared.

Condition (b) addresses the case where the error locator polynomial $\sigma(x)$ has duplicate roots. Condition (b) also addresses the case where roots of the error locator polynomial $\sigma(x)$ indicate errors lying outside of valid locations of the codeword. Here, a shortened codeword of length $B < 2^w - 1$ should only have errors in the shortened portion of the codeword. These two cases arise from an incorrectly formed error locator polynomial $\sigma(x)$, indicating that a received codeword is uncorrectable.

Condition (c): Error and Erasure Locations Coincide

If any symbol is a member of the set of error locations and also a member of the set of erasure locations, then an uncorrectable codeword is declared. In the preferred circuit of FIG. 2, an AND gate 321 drives a third counter 313 when a zero term is detected by both the null comparators 301 and 302. The output of this counter 313 is provided to a sixth comparator 306, to provide a third logic input (c) to the OR gate 320.

Condition (c) applies when the error locator polynomial $\sigma(x)$ has a root that indicates an error lying at a location already marked as an erasure. Hence, condition (c) indicates an incorrectly formed error locator polynomial $\sigma(x)$, resulting from a codeword that is uncorrectable.

Condition (d): $\deg \omega(x) \geq$ nerrors+nerasures

Condition (d) follows from the basic definitions of the errata locator and evaluator polynomials, in this embodiment the error locator polynomial $\sigma(x)$, the erasure locator polynomial $\Lambda(x)$ and the errata evaluator polynomial $\omega(x)$. In particular, these polynomials show that if there are $\tau$ errata (i.e. errors plus erasures) in a codeword, and the codeword is correctable, then the errata evaluator polynomial $\omega(x)$ should have a degree of at most $\tau-1$. Thus, if the degree of $\omega(x)$ exceeds $\tau-1$, the codeword is identified as being uncorrectable.

In the preferred circuit of FIG. 2, an uncorrectable codeword is determined when the degree of the errata evaluator polynomial deg $\omega(x)$ is greater than or equal to the total number of error and erasure locations. The variable nerasures as output by the second counter 312 is added to the nerrors as output by the fourth counter 314 and the result compared to deg$\omega(x)$ in comparator logic 310, as a fourth logic input (d) to the OR gate 320.

Other possibilities are available to achieve an equivalent logic function. For example, if condition (b) is not satisfied then it can be assumed that nerrors is equal to deg$\sigma(x)$, allowing a substitution of deg$\sigma(x)$ for nerrors, if desired in a particular circuit design.

Condition (e): nerasures+2*nerrors>2T

An uncorrectable codeword is declared if the number of errors and erasures combined are greater than the guaranteed strength of the code. In this fifth logic function, an uncorrectable codeword is identified if the number of erasures plus twice the number of errors is greater than the codeword strength 2T, i.e. nerasures+2*nerrors>2T. In the circuit of FIG. 2, comparator logic 309 provides a fifth logic input (e) to the OR gate 320. Again, it is possible to substitute the variable nerasures and nerrors for equivalent values deg$\Lambda(x)$ and deg$\sigma(x)$.

Condition (f): Any Symbol Error Location has a Zero Correction Magnitude.

In the sixth logic function, an uncorrectable codeword is identified if any symbol error location has a zero correction magnitude as represented by the errata evaluator polynomial $\omega(x)$. That is, for every symbol error that is located by the error locator polynomial $\sigma(x)$, then a non-zero correction magnitude should be provided by the errata evaluator polynomial $\omega(x)$. By contrast, it is possible that a symbol declared as an erasure was in fact correct, in which case the correction magnitude is zero for the location of that symbol erasure.

In the circuit 300 of FIG. 2, a fifth counter 315 is driven by an AND gate 322 in response to null determining comparators 302 and 303 coupled to outputs of polynomial evaluators 54 and 56 respectively. Comparator logic 308 determines when the counter 315 outputs a non-zero count, to provide a sixth input (f) to the OR gate 320.

Condition (g): deg$\Lambda(x) \neq$ nerasures

In this seventh logic function, an uncorrectable codeword is declared where the number of erasures is not equal to the degree of the erasure locator polynomial deg$\Lambda(x)$. Typically, the erasure locator polynomial $\Lambda(x)$ is formed directly from the declared erasures received by the decoder. It is unlikely that a correctly designed decoder will fail to generate the erasure locator polynomial $\Lambda(x)$ correctly. Hence, this seventh logic function is optional. The fifth comparator 305 then compares nerasures with the degree of $\Lambda(x)$, e.g. as provided by the first evaluator 52. This comparison forms a seventh input (g) to the OR gate 320.

The output of the detector circuit 300 is valid once the entire codeword has been processed, as determined by a counter 311 and a comparator 304. A load signal is received to indicate that a new codeword is available at the detector circuit, and a done signal is asserted to show that the output is valid. The status output provided from the circuit 300 indicates whether an uncorrectable codeword has been determined. Ideally, the detector circuit distinguishes between correctable and uncorrectable codewords. In the example embodiment the output latch 361 indicates a correctable or uncorrectable codeword (i.e. 0=correctable, 1=uncorrectable). In other embodiments, the nature of an uncorrectable error is output, e.g. responsive to the conditions (a) to (g).

The preferred embodiment has been described with logic operations that detect an uncorrectable codeword. In an alternate embodiment of the invention each logical test is reversed such that the detector identifies a correctable codeword, i.e. which passes the conditions (a) to (g).

The method and apparatus have been described which allow uncorrectable codewords to be identified accurately and efficiently in Reed-Solomon decoder handling errors and erasures. Advantageously, circuitry downstream of a Reed-Solomon decoder is informed that a severely corrupted codeword has been encountered. Appropriate action can then be taken such as requesting re-transmission or applying other data recovery techniques. When applied to a data storage medium, the detection of severely corrupted data may assist future management of the storage medium, such as avoiding physical areas of the medium responsible for the corruption. Other advantages of the present invention will be clear from the foregoing description.

The invention claimed is:

1. A method of identifying uncorrectable codewords in a Reed-Solomon decoder handling errors and erasures, the Reed-Solomon decoder including at least six hardware logic functions, the method comprising the steps of:
   indicating an uncorrectable codeword when any one or more of the following conditions (a) to (f) is satisfied:
   (a) no solution to key equation $\sigma(x)T(x) \equiv (x) \bmod x^{2T}$ is found by a first one of said at least six hardware logic functions;
   (b) deg $\sigma(x) \neq$ nerrors is determined by a second one of said at least six hardware logic functions;
   (c) error and erasure locations coincide is determined by a third one of said at least six hardware logic functions;
   (d) deg $\omega(x) \geq$ nerrors+nerasures is determined by a forth one of said at least six hardware logic functions;
   (e) nerasures+2*nerrors>2T is determined by a fifth one of said at least six hardware logic functions and
   (f) an error location has a zero correction magnitude is determined by a sixth one of said at least six hardware logic functions;
   where nerrors and nerasures represent, respectively, a number of errors with reference to an error locator polynomial $\sigma(x)$ and a number of erasures with reference to an erasure locator polynomial $\Lambda(x)$, 2T is the strength of a Reed-Solomon code, $\omega(x)$ is an errata evaluator polynomial, and T(x) is a modified syndrome polynomial.

2. The method of claim 1, comprising evaluating the condition (a) as a preliminary step, and then evaluating the conditions (b) to (f).

3. The method of claim 1, wherein the method comprises identifying a codeword as correctable if none of at least the conditions (a) to (f) are satisfied.

4. The method of claim 1, wherein the method comprises indicating an uncorrectable codeword in response to condition (g) deg $\Lambda(x) \neq$ nerasures.

5. The method of claim 1, wherein the method comprises receiving the error locator polynomial $\sigma(x)$, the erasure locator polynomial $\Lambda(x)$ and the errata evaluator polynomial $\omega(x)$; forming a set of error locations, and a set of erasure locations, and forming variables nerrors and nerasures representing the size of each set, respectively; and finding deg $\sigma(x)$, deg $\Lambda(x)$, and deg $\omega(x)$, as a degree of the error locator polynomial $\sigma(x)$, the erasure locator polynomial $\Lambda(x)$ and the errata evaluator polynomial $\omega(x)$, respectively.

6. A detector circuit arranged to identify an uncorrectable codeword, for use in a Reed-Solomon decoder handling errors and erasures, the circuit comprising:
   a logic unit arranged to identify each condition:
   (a) no solution to key equation $\sigma(x)T(x) \equiv (x) \bmod x^{2T}$;
   (b) deg $\sigma(x) \neq$ nerrors;
   (c) error and erasure locations coincide;
   (d) deg $\omega(x) \geq$ nerrors+nerasures;
   (e) nerasures+2*nerrors>2T; and
   (f) an error location has a zero correction magnitude;
   where nerrors and nerasures represents, respectively, a number of errors and erasures with reference to an error locator polynomial $\sigma(x)$ and an erasure locator polynomial $\Lambda(x)$, 2T is the strength of a Reed-Solomon code, $\omega(x)$ is an errata evaluator polynomial, and T(x) is a modified syndrome polynomial; and
   an indicator unit arranged to indicate an uncorrectable codeword, responsive to the logic unit.

7. The circuit of claim 6, wherein the circuit comprises a counter arranged to count nerrors and nerasures as the size of a set of error locations derived from the error locator polynomial $\sigma(x)$, and a set of erasure locations derived from the erasure locator polynomial $\Lambda(x)$, respectively.

8. The circuit of claim 6, wherein the logic unit is arranged to identify an uncorrectable codeword in response to condition (g) deg $\Lambda(x) \neq$ nerasures.

9. A method of identifying uncorrectable Reed-Solomon codewords in a group Reed-Solomon codewords being passed to a Reed-Solomon decoder, the Reed-Solomon decoder including a polynomial generation unit, a polynomial evaluation unit, an uncorrectable error detector and an error correction block, the method comprising:
   generating polynomial data in the polynomial generation unit representing locations and magnitudes of errors and erasure in a Reed-Solomon codeword passed to the Reed-Solomon decoder,
   performing a Chien search on said polynomial data in the polynomial evaluation unit and solving Forney's equations to determine correction locations and magnitudes to be applied to the Reed-Solomon codeword passed to the Reed-Solomon decoder, and
   detecting, in the uncorrectable error detector, that the Reed-Solomon codeword passed to the Reed-Solomon decoder is an uncorrectable codeword when any one or more of the following conditions (a) to (f) is satisfied:
   (a) no solution to key equation $\sigma(x)T(x) \equiv (x) \bmod x^{2T}$ is found by a first logic means;
   (b) deg $\sigma(x) \neq$ nerrors is determined by a second logic means;
   (c) error and erasure locations coincide is determined by a third logic means;
   (d) deg $\omega(x) \geq$ nerrors+nerasures is determined by a forth logic means;

(e) nerasures+2*nerrors>2T is determined by a fifth logic means and (f) an error location has a zero correction magnitude is determined by a sixth logic means;

where nerrors and nerasures represent, respectively, a number of errors with reference to an error locator polynomial $\sigma(x)$ and a number of erasures with reference to an erasure locator polynomial $\Lambda(x)$, 2T is the strength of a Reed-Solomon code, $\omega(x)$ is an errata evaluator polynomial, and $T(x)$ is a modified syndrome polynomial; and if the Reed-Solomon codeword passed to the Reed-Solomon decoder is not an uncorrectable codeword, then performing error correction on the Reed-Solomon codeword passed to the Reed-Solomon decoder using the correction locations and magnitudes determined by solving Forney's equations.

* * * * *